United States Patent [19]

Roy et al.

[11] Patent Number: 5,370,736

[45] Date of Patent: Dec. 6, 1994

[54] HORIZONTAL REACTOR HARDWARE DESIGN

[75] Inventors: Sudipto R. Roy, Dallas County; Phil Glynn, McKinney, both of Tex.

[73] Assignee: Texas Instruments Incorporated, Dallas, Tex.

[21] Appl. No.: 966,225

[22] Filed: Oct. 26, 1992

[51] Int. Cl.5 ............................................. C23C 16/00
[52] U.S. Cl. ................................. 118/719; 118/715; 118/725; 118/733
[58] Field of Search ................ 118/715, 725, 719, 733

[56] References Cited

U.S. PATENT DOCUMENTS

| | | | |
|---|---|---|---|
| 3,828,722 | 8/1974 | Reuter | 118/725 |
| 4,347,431 | 8/1982 | Pearce | 118/725 |
| 4,699,084 | 10/1987 | Wilson | 118/725 |
| 4,711,197 | 12/1987 | Taylor, Sr. | 118/715 |
| 4,793,283 | 12/1988 | Sarkozy | 118/725 |
| 4,803,948 | 2/1989 | Nakagawa | 118/725 |
| 4,920,920 | 5/1990 | Shigeki | 118/725 |
| 5,064,367 | 11/1991 | Philipossian | 118/725 |

Primary Examiner—Richard Bueker
Attorney, Agent, or Firm—Alan K. Stewart; Richard A. Donaldson; William E. Hiller

[57] ABSTRACT

An new horizontal reactor hardware contains a reactor tube with an insulation block and a flange with exhaust outlets. The insulation block provides high temperature control which reduces condensation and process by-product buildup within the reactor tube. A cylindrical flange, which is connected to the end of the reactor tube, provides exhaust outlets integral with and extending from the flange. The exhaust outlets isolate metal components from the process environment. The flange is held in place at the end of the reactor tube by a clamp. The clamp presses the flange against the end of the reactor tube to form a seal at the junction between the reactor tube and the flange.

19 Claims, 3 Drawing Sheets

HORIZONTAL REACTOR HARDWARE DESIGN

FIELD OF THE INVENTION

The invention relates to apparatus used for the processing of silicon wafers. In particular, the invention relates to a new horizontal reactor hardware design. Most especially, the invention relates to a horizontal reactor which provides contamination control and improved performance for silicon wafer processing.

BACKGROUND OF THE INVENTION

In wafer fabrication processes such as diffusion, deposition, oxidation and annealing, semiconductor wafers in boats are treated in horizontal tubular chambers encircled with electrical heating elements with heated, toxic, flammable or corrosive gases. A typical horizontal reactor flows a gas into the reactor tube through the source end. The gas is then carried through the tube length and out through exhaust holes. A typical horizontal atmospheric reactor system has process and contamination control problems due to uncontrolled exhaust of reactant and process by-product gases. Due to corrosive nature of most of the gases, exhaust hardware design has been a problem because most metals corrode.

The horizontal reactor tube has two zones: a heated zone and a scavenger zone. The heated zone has several zone elements to heat up the zone and the temperature is typically maintained using proportional-integral-derivative (PID) control. The scavenger zone is an unheated zone which extends from the end of the heating element to the door. The typical horizontal reactor tube has a small hole, typically ¼" in diameter, near the door end at the bottom. The purpose of the hole is to allow the process by-products to be exhausted to the building exhaust, but undesirable dripping and condensation occurs in the scavenger area as a result. A typical process temperature ranges anywhere from 500° C. to 1225° C. The typical reactor uses a quartz door which fits against the quartz tube directly.

The problems with this typical reactor are numerous. This conventional hardware makes the process not only very dirty but also poses severe corrosion and safety problems due to dripping of hazardous by-products inside and outside the reactor tube. The wide temperature differences between the heated zone and the scavenger zone forces the process by-products to condense and buildup inside the reactor tube extending throughout the length of the scavenger zone. In most applications, this not only causes process drifts due to autodoping created by the buildup, but also makes it necessary to have a frequent cleaning to maintain the process specification. In addition, the wafer load size is limited due to the build up and uncontrolled temperature in the scavenger zone. Usually, the process by-products are very corrosive and there are no compatible materials that can both withstand elevated temperatures, and at the same time cause no metal contamination problems due to corrosion. Hence, there is no direct exhaust/flow control known to date which will address all the above mentioned problems. Improvements in horizontal reactors are necessary to reduce process drifts due to process by-products buildup, to minimize frequency of cleaning, to increase the wafer load capacity of the reactors, and to enhance safety.

SUMMARY OF THE INVENTION

Accordingly, it is a technical advantage of this invention to provide a new horizontal reactor design which minimizes the process by-product buildup inside the reactor in order to reduce process drifts, minimize frequency of cleaning, increase wafer load capacity, and enhance safety.

Another advantage of the present invention is the elimination of all exposed metal parts in areas where heating and corrosion will produce contamination, causing potential minority carrier lifetime degradation.

The attainment of the foregoing and related objects may be achieved through use of the novel horizontal reactor herein disclosed. In accordance with this invention, the new horizontal reactor contains a reactor tube with an insulation block which surrounds the outer surface of the unheated portion of the reactor tube. The insulation block provides high temperature control which reduces condensation within the reactor tube. A cylindrical flange, which is connected to the end of the reactor tube, provides exhaust outlets integral with and extending from the flange. The exhaust outlets isolate metal components from the process environment. The flange is held in place at the end of the reactor tube by a clamp. The clamp presses the flange against the end of the reactor tube to form a seal at the junction between the reactor tube and the flange. A quartz door forms a seal at the other end of the flange. This configuration provides an all quartz tube, flange, and door configuration which can withstand elevated temperatures caused by the insulation block.

BRIEF DESCRIPTION OF THE DRAWINGS

In the drawings.

Corresponding numerals and symbols in the different figures refer to corresponding parts unless otherwise indicated.

DETAILED DESCRIPTION OF THE PREFERRED EMBODIMENT

A preferred embodiment of the invention is described below. This embodiment is merely exemplary. Those skilled in the art will appreciate that changes can be made to the disclosed embodiment without departing from the spirit and scope of the invention.

Figure 1:
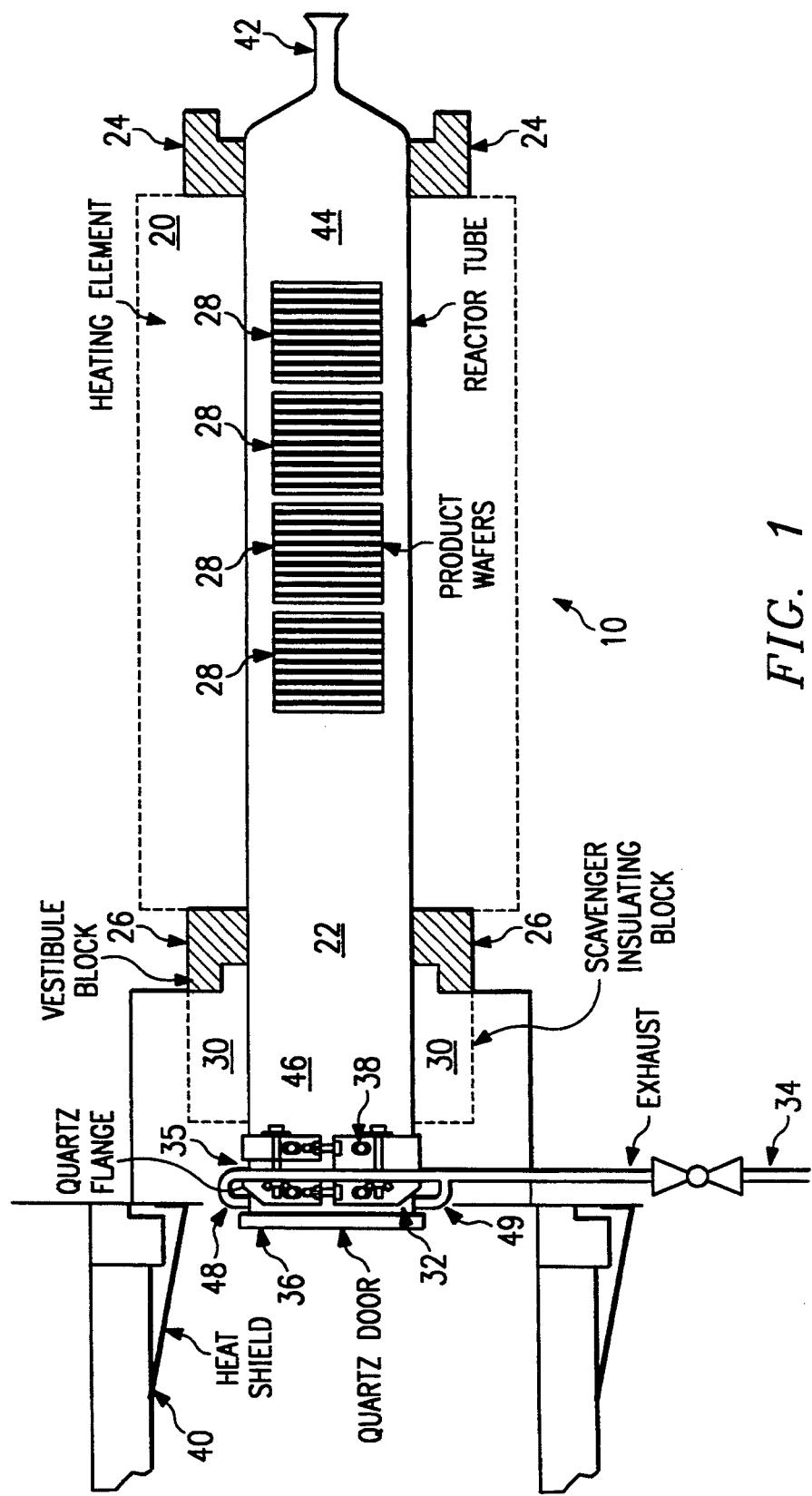
FIG. 1 is a side view of the new horizontal reactor hardware.

The new horizontal reactor configuration is shown in FIG. 1. The reactor includes heating element 20, reactor tube 22, vestibule blocks 24 and 26, product wafers 28, scavenger insulating block 30, quartz flange 32, exhaust 34, quartz door 36, stainless steel clamp 38, and heat shield 40.

The reactor tube 22, heating element 20, vestibule blocks 24 and 26, and quartz door 36 are elements of a typical horizontal reactor. The reactor 10 has as one of its principal components a cylindrical quartz reactor tube 22 providing a quartz chamber within which silicon wafers 28 are processed by well known techniques in the production of integrated circuits on silicon chips. One end of the reactor tube 22 is open for the introduction and removal of silicon wafers 28 into and from the reactor tube 22. The other end of the reactor tube 22 is the source end 42 where the gases enter.

The reactor tube 22 has two zones: heated zone 44 and a scavenger zone 46. A heating element 20 surrounds the outer surface of the cylindrical reactor tube 22 only over the heated zone 44. The heating element 20 has either three or five zone elements to heat up the zone 44. The temperature is typically maintained using PID control. The portion of the reactor tube 22 between the end of the heating element 20 and the open end of the reactor tube 22 is referred to as the scavenger zone 46. The scavenger zone 46 is an unheated zone that extends up to the end of the reactor tube 22.

Figure 2:
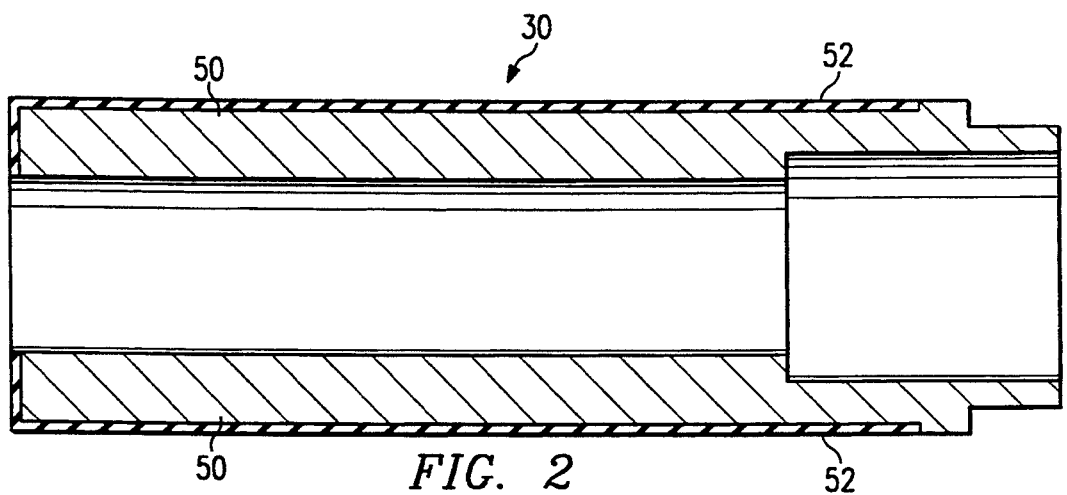
FIG. 2 is a side view of the insulating block of the invention.

The scavenger insulating block 30, shown in FIG. 2, is a cylindrical insulation block. The insulating block 30 has an inner diameter that is larger than the outer diameter of the reactor tube 22 so that the insulating block 30 surrounds the outside of the reactor tube 22 as shown in FIG. 1. The scavenger insulating block 30 extends horizontally over the scavenger zone 46 from the vestibule block 26 to approximately two inches before the stainless steel clamp 38. The insulation block 30 consists of a rigid insulation material 50 and a stainless steel outer shell 52. The scavenger insulating block 30 maintains the process gases and the process by-products at an elevated temperature which prevents condensation and subsequent buildup inside and outside the reactor tube 22.

Figure 3:
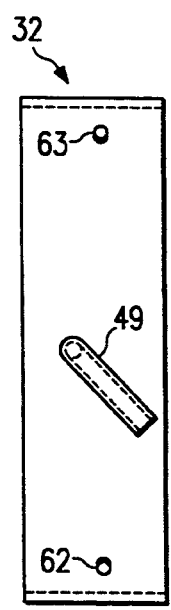
FIG. 3 is a side view of the quartz flange of the invention.
Figure 4:
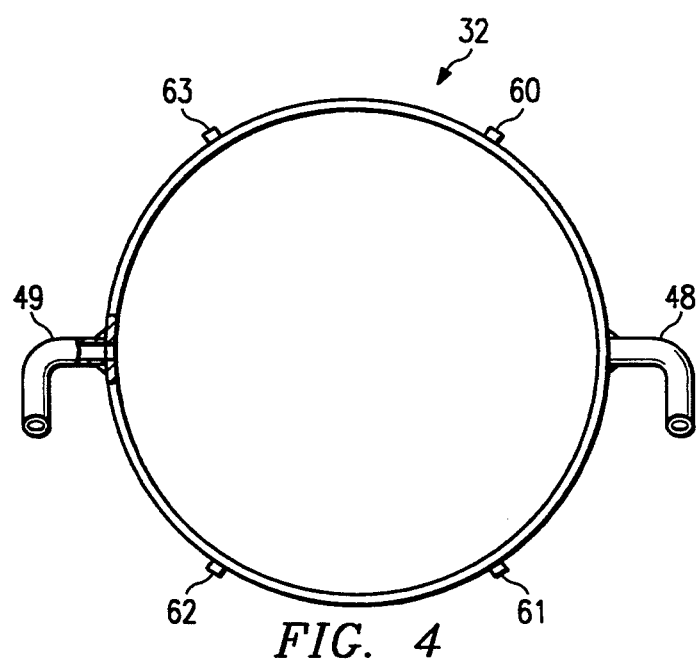
FIG. 4 is a cross-sectional view of the quartz flange of the invention.
Figure 5:
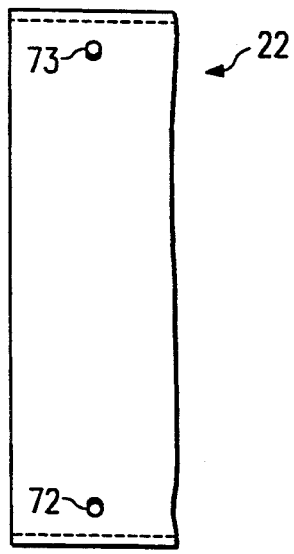
FIG. 5 is a side view of the open end of the reactor tube of the invention.
Figure 6:
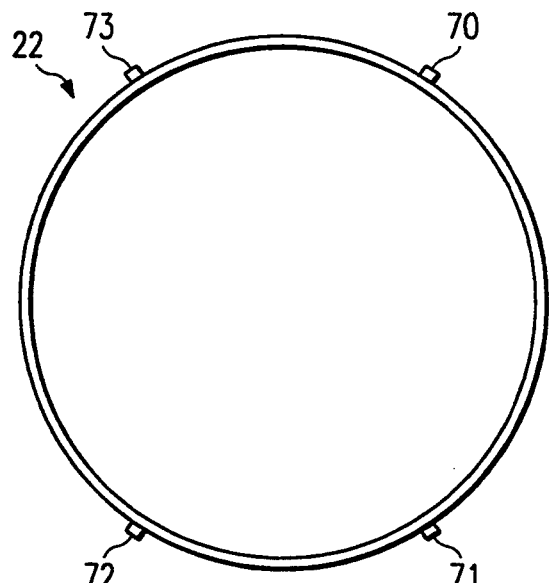
FIG. 6 is a cross-sectional view of the reactor tube of the invention.

The quartz flange 32, shown in FIGS. 3 and 4, is made of clear fused quartz. The flange 32 is positioned between the reactor tube 22 and the quartz door 36. As seen in FIG. 1, the flange 32 and reactor tube 22 have the same diameter of approximately nine inches. In accordance with the preferred embodiment, one end of the flange 32 is aligned with and connected to the end of the reactor tube 22. The flange 32 and the reactor tube 22 are held together by the stainless steel clamp 38 positioned over the corresponding quartz extensions 60–63 and 70–73, shown on the quartz flange 32 in FIGS. 3 and 4, and on the quartz reactor tube 22 in FIGS. 5 and 6. The clamp 38 presses the flange 32 and the reactor tube 22 together so that a seal is formed between the flange 32 and the reactor tube 22.

The flange 32 has two ⅜ inch diameter quartz exhaust ports 48 and 49 for direct exhaust as shown in FIGS. 3 and 4. The flange exhaust ports 48 and 49 consist of ⅜ inch diameter quartz tubing extending two inches from the flange 32 before connecting to a stainless steel house exhaust line 34, shown in FIG. 1. The two inches of quartz tubing allows isolation of all metal components from the process environment. The quartz door 36 makes a sealed contact with the end of flange 32 as shown in FIG. 1.

Figure 7:
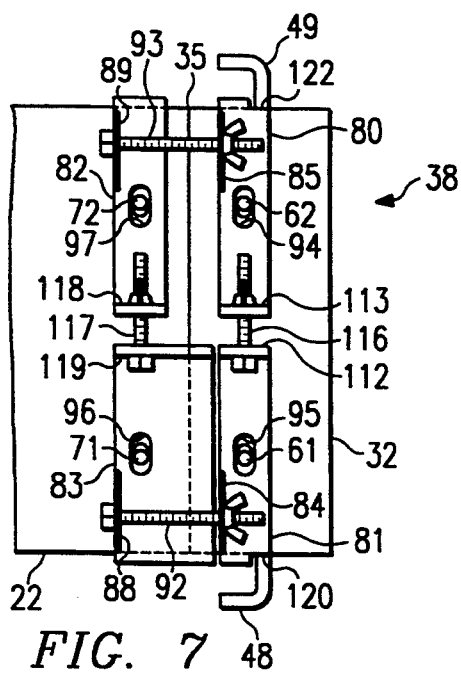
FIG. 7 is a side view of the clamp of the invention.
Figure 9:
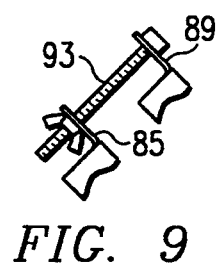
FIG. 9 is a view of a bolt and bolt arms of the clamp of the invention.
Figure 10:
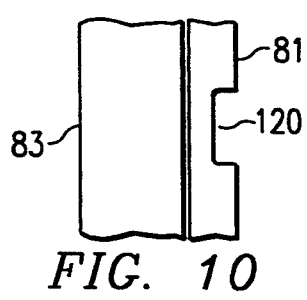
FIG. 10 is a view of a notch in the clamp of the invention.
Figure 8:
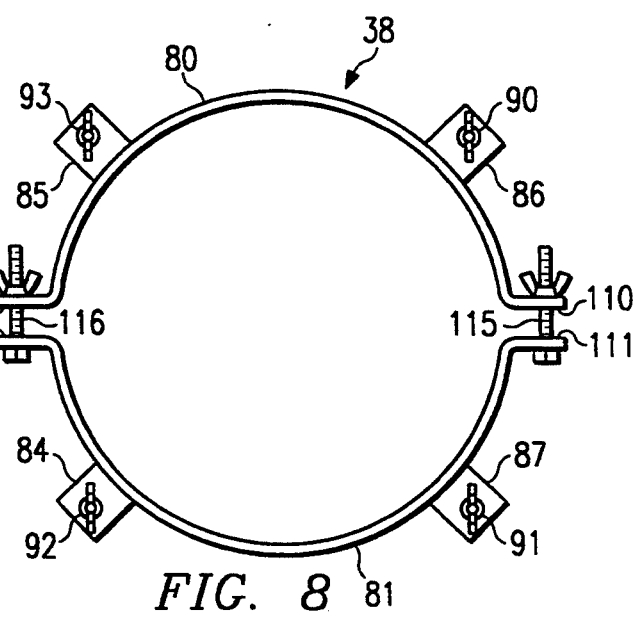
FIG. 8 is a front view of the clamp of the invention.

The stainless steel clamp 38, shown in FIGS. 7, 8, 9, and 10, has three one inch wide semicircular stainless steel strips 80–82, and one two inch wide semicircular stainless steel strip 83. The two inch wide strip 83 rests against both the flange 32 and the reactor tube 22 and is used to align and stabilize the flange 32 with the reactor tube 22. The four strips 80–83 have eight bolt arms, two on each strip, that extend outward from the sides of the strips 80–83. Six of the bolt arms 84–89 are shown in FIGS. 7 and 8, the other two bolt arms are not shown. Bolt arms 84 and 85 are connected to bolt arms 88 and 89 by bolts 92 and 93, respectively. Bolt arms 86 and 87 are connected to two bolt arms, not shown, by bolts 90 and 91. Bolts 90–93 are used to press the flange 32 against the end of the reactor tube 22. The four strips 80–83 also have eight slots, two slots on each strip. Four of the slots 94–97 are shown in FIG. 7. The slots are positioned over the quartz extensions 60–63 and 70–73. When the bolts 90–93 are tightened, the strips 80–83 of the clamp 38 are held in place horizontally by the extensions 60–63 and 70–73.

Eight additional bolt arms are integral with and extend outward from the ends of the strips 80–83. Six of the bolt arms 110–113, 118, and 119 are shown in FIGS. 7 and 8, while the other two bolt arms are not shown. The bolt arms, including 110–113, 118, and 119, are connected together by four bolts, three of the bolts 115–117 are shown in FIGS. 7 and 8, the fourth bolt is not shown. Each of the four bolts, including 115–117, connect the arm of one strip to the arm of another strip. The four bolts, including 115–117, are tightened so that the clamp 38 is pressed against the quartz flange 32 and against the reactor tube 22 so that the juncture 35 between the quartz flange 32 and the reactor tube 22 is aligned. Each of the two strips 80 and 81 that are attached to the quartz flange 32 have notches 120 and 122, shown in FIGS. 7 and 10, for the exhaust outlets 48 and 49, respectively.

The structure as disclosed minimizes condensation and process by-product buildup both inside and outside the reactor tube. This provides several advantages. The cleaner reactor tube environment reduces process drifts in the wafers. Also, the wafer load capacity of the reactors are doubled due to the cleaner environment in the reactor tube. And, the down time of the reactors is significantly reduced because of less frequent cleaning of the reactor tubes.

Also, the structure as disclosed minimizes the exposure of materials other than quartz to the gas stream and reactor interior. And, stainless steel is the material of choice for the clamp which attaches the quartz flange to the quartz reactor tube because stainless steel has more resistance to corrosion than other metals.

A preferred embodiment has been described in detail hereinabove. It is to be understood that the scope of the invention also comprehends embodiments different from the one described, yet within the scope of the claims.

For example, the insulation block, the clamp, and the exhaust outlets could be made of other comparable materials. Also, the flange could be of shapes other than cylindrical, such as rectangular, so long as the junction between the flange and reactor tube forms a seal.

While this invention has been described with reference to an illustrative embodiment, this description is not intended to be construed in a limiting sense. Various modifications and combinations of the illustrative embodiment, as well as other embodiments of the invention, will be apparent to persons skilled in the art upon reference to the description. It is therefore intended that the appended claims encompass any such modifications or embodiments.

What is claimed is:

1. A horizontal reactor comprising:
a quartz reactor tube;
a heating element which is positioned over one portion of the reactor tube;
an insulation block which is positioned over another portion of the reactor tube;
a quartz flange connected to an end of the reactor tube for isolating the reactor tube from outside contaminants; and
at least one quartz exhaust outlet integral with and extending outward from the flange for isolating the flange from metal components.

2. The horizontal reactor of claim 1 wherein the at least one quartz exhaust outlet extends at least two inches from the flange.

3. The horizontal reactor of claim 1, wherein the insulation block includes:
a rigid insulation material; and
a metal outer shell covering and supporting the insulation material.

4. The horizontal reactor of claim 3, wherein the metal outer shell is formed of stainless steel.

5. The horizontal reactor of claim 1, further comprising:
a source end of the reactor tube;
a first vestibule block positioned on an outside surface of the reactor tube between the source end and the heating element; and
a second vestibule block positioned on an outside surface of the reactor tube between the heating element and the insulation block.

6. The horizontal reactor of claim 1 wherein the at least one quartz exhaust outlet is coupled to a metal exhaust line.

7. The horizontal reactor of claim 1 wherein the outside contaminants are metallic contaminants.

8. The horizontal reactor of claim 1, further comprising a clamp connecting the flange to the reactor tube, the clamp pressing the flange against the end of the reactor tube to form a seal at the junction between the reactor tube and the flange.

9. A horizontal reactor comprising:
a quartz reactor tube;
a heating element which is positioned over one portion of the reactor tube;
a quartz flange connected to an end of the reactor tube for isolating the reactor tube from outside contaminants; and
at least one quartz exhaust outlet integral with and extending outward from the flange for isolating the flange from metal components.

10. The horizontal reactor of claim 9 wherein the at least one quartz exhaust outlet includes;
a first exhaust outlet; and
a second exhaust outlet positioned on the flange diametrically opposite the first exhaust outlet.

11. The horizontal reactor of claim 9, further comprising a clamp connecting the flange to the reactor tube, the clamp pressing the flange against the end of the reactor tube to form a seal at the junction between the reactor tube and the flange.

12. The horizontal reactor of claim 11, wherein the clamp is positioned on an outside surface of the reactor tube and an outside surface of the flange.

13. The horizontal reactor of claim 12, wherein the clamp consists of four semicircular strips, one of the strips being wider than the other three strips for stability and alignment of the flange.

14. The horizontal reactor of claim 13, wherein the strips are formed of stainless steel.

15. The horizontal reactor of claim 9, further comprising a door which fits against an end of the flange.

16. The horizontal reactor of claim 9, wherein the flange has a cylindrical shape.

17. A method of reducing process by-product buildup in a horizontal reactor tube, which comprises:
heating a first portion of the reactor tube;
insulating a second portion of the reactor tube to maintain a high temperature in the second portion of the reactor tube for reducing condensation inside of the second portion of the reactor tube; and
directing exhaust from the reactor tube through a flange having at least one quartz exhaust outlet integral with and extending outward from the flange for isolating the reactor tube from metal components.

18. A method of reducing process by-product buildup in a horizontal reactor tube, as recited in claim 17, wherein the outside contaminants are metallic contaminants.

19. A method of reducing process by-product buildup in a horizontal reactor tube, which comprises:
heating a first portion of the reactor tube; and
directing exhaust from the reactor tube through a flange having at least one quartz exhaust outlet integral with and extending outward from the flange for isolating the reactor tube from metal components.

* * * * *